(12) United States Patent
Ishida et al.

(10) Patent No.: US 6,750,706 B2
(45) Date of Patent: Jun. 15, 2004

(54) CONTROL METHOD AND CIRCUIT FOR FEEDFORWARD DISTORTION COMPENSATION AMPLIFIER

(75) Inventors: Kaoru Ishida, Shijonawate (JP); Toshimitsu Matsuyoshi, Katano (JP); Naoki Takachi, Yokohama (JP); Yuji Saito, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/167,687

(22) Filed: Jun. 11, 2002

(65) Prior Publication Data

US 2003/0016081 A1 Jan. 23, 2003

(30) Foreign Application Priority Data

Jun. 11, 2001 (JP) ........................................ 2001-175134

(51) Int. Cl.$^7$ ............................... H03F 3/66; H03F 1/26
(52) U.S. Cl. .......................................... 330/52; 330/151
(58) Field of Search ........................... 330/52, 149, 151

(56) References Cited

U.S. PATENT DOCUMENTS 5,815,036 A * 9/1998 Yoshikawa et al. ........... 330/52

FOREIGN PATENT DOCUMENTS

JP 2000-196366 7/2000

* cited by examiner

Primary Examiner—Steven Mottola
(74) Attorney, Agent, or Firm—RatnerPrestia (57) ABSTRACT

A method of controlling a feedforward distortion compensation amplifier has steps of detecting a distortion component generated in a main amplifier by coupling a signal branched from a signal input to the main amplifier and containing a plurality of carriers of different frequencies to a signal branched from an output signal from the main amplifier so that the coupling causes the carrier components to cancel each other, recoupling the signal resulting from the coupling to the output signal from the main amplifier, and adjusting an amplitude and phase of at least one of the signals to be recoupled so that distortion components cancel each other upon recoupling, wherein a first and second pilot signals obtained from a first and second pilot signal sources are inserted into the input signal to or output signal from the main amplifier, parts of the signal resulting from the recoupling are taken out through branching, and the signals taken out through branching are mixed with the first and second pilot signals, respectively, and thus down-converted to generate down convert signals so that control signals to adjust the amplitude and phase are generated according to the down convert signals.

16 Claims, 8 Drawing Sheets

CONTROL METHOD AND CIRCUIT FOR FEEDFORWARD DISTORTION COMPENSATION AMPLIFIER

BACKGROUND OF THE INVENTION

1. Field of the Invention

The present invention relates to an FF distortion compensation amplifier comprising a feedforward (hereinafter referred to as "FF") loop that compensates for distortion occurring in a main amplifier, for example, intermodulation distortion, and in particular, to a control circuit and method that optimizes the FF loop.

2. Related Art of the Invention

Mobile communications base stations or the like transmit by radio multicarrier signals which have predetermined frequency intervals and which are each appropriately modulated, after radio frequency amplification. If an amplifier for use in radio-frequency amplification has insufficient linearity, various types of distortion for example, intermodulation distortion may occur, Such distortion hinders realization of normal and high-quality communications. Thus, for amplification of a multicarrier signal, the entire frequency band to which the multicarrier signal belongs must be appropriately linear, and a strict tolerance is specified for the distortion.

As an approach to implementation of a distortion compensation amplifier suitable for amplification of a multicarrier signal, an FF amplifying method is described in Japanese Patent Laid-Open No. 2000-196366 or the like.

With this FF amplifying method, if on a signal path from a signal input end through a main amplifier to a signal output end, i.e. a signal path over which signals to be amplified or amplified signals are transmitted (this signal path is hereinafter referred to as a "main line"), a signal branched from a point located after the main amplifier and a signal branched from a point located before the main amplifier on the main line travel an equal electric length and have the same amplitude and opposite phases, then these signals can be coupled together to cause their carrier components to cancel each other to take out a signal corresponding to distortion caused by the main amplifier and its peripheral circuit.

The thus taken-out signal, which corresponds to the distortion, is passed through a distortion compensation loop and recoupled to the signal on the main line. When adjustment of amplitude or phase is appropriately carried out in the distortion compensation loop or main line so that a signal delay occurring on the main line is compensated for by a signal delay in the distortion compensation loop or that a distortion component contained in the signal on the main line and the signal obtained from the distortion compensation loop have the same amplitude and opposite phases, the above described signal recoupling operation compensates for the distortion occurring in the main amplifier.

Figure 8:
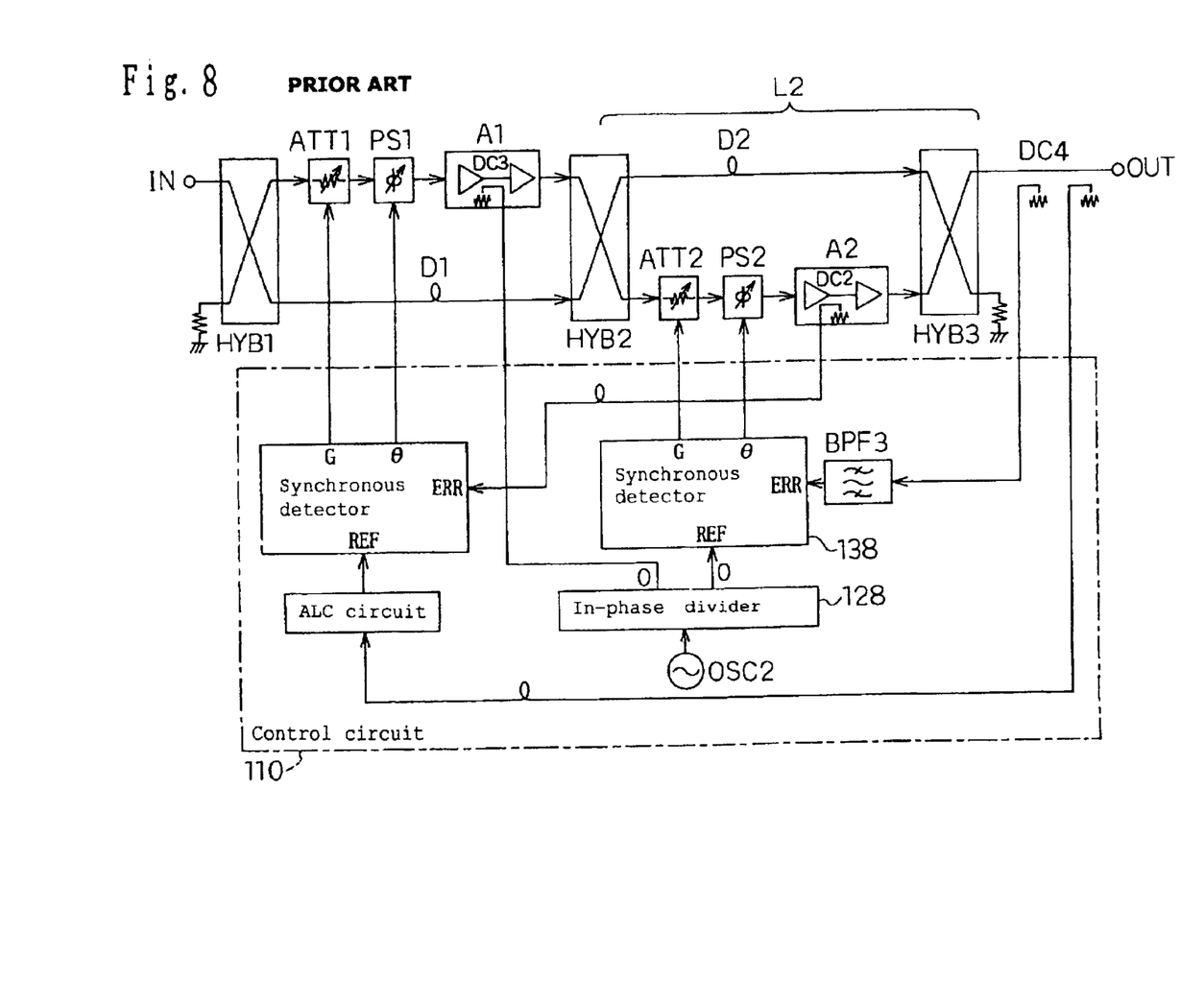
FIG. 8 is a diagram showing a configuration of an example of a conventional FF amplifier.

FIG. 8 shows an example of a configuration of a conventional FF amplifier. In this figure, for example, a multicarrier signal input through a signal input end IN is branched into two by a hybrid HYB1. One of the branched signals is amplified by the main amplifier A1 and then reaches a hybrid HYB2. The other signal is supplied to the hybrid HYB2 via a delay line D1. The delay line D1 compensates for a signal delay that may occur in the main amplifier A1, and a signal delayed via the delay line D1 is coupled by the hybrid HYB2 to a signal containing distortion occurring in the main amplifier A1.

As described above, carrier components are mutually cancelled to take out (detect) distortion occurring in the main amplifier A1 by coupling a signal branched from an output signal from the main amplifier A1 to a signal obtained via the delay line D1 as described above. To achieve this, upon the coupling at the hybrid HYB2, the carrier components of the two signals must have opposite phases and the same amplitude and follow the same timing. The delay line D1 is means of allowing carrier components to follow the same timing, and a variable attenuator ATT1, a variable phase shifter PS1, and a control circuit 110 that adjusts and controls a signal attenuation G1 and a phase shift θ1 in the variable attenuator ATT1 and the variable phase shifter PS1, respectively, to optimum values are means of allowing carrier components to have opposite phases and the same amplitude.

Next, in the FF amplifier shown in FIG. 8, carrier components amplified by the main amplifier A1 and containing distortion components are delivered to the hybrid HYB2. Then, in a distortion compensation loop L2, a signal containing no carrier signals but only distortion components is supplied to a hybrid HYB3 via the delay line D2. Simultaneously, the same signal is amplified by an auxiliary amplifier A2 and supplied to a hybrid. In the distortion compensation loop L2, the two signals have opposite phases and the same amplitude and follow the same timing upon coupling at HYB3 in order to compensate for (cancel) the distortion by coupling the signal from the delay line D2 and the signal from the auxiliary amplifier A2 together. The delay line D2 is means of allowing distortion components to follow the same timing, and the control circuit 110 that adjusts and controls a signal attenuation G2 in a variable attenuator ATT2 and a phase shift θ2 in a variable phase shifter PS2 to optimum values is means of allowing distortion components to have opposite phases and the same amplitude.

In the FF amplifier shown in FIG. 8, an optimization process in the distortion compensation loop L2 is executed by inserting and detecting a pilot signal as described below. The control circuit 110 comprises a synchronous detector 138, an oscillator OSC2 that serves to generate a pilot signal, and an in-phase divider 128 that divides the signal from the oscillator OSC2 into two: a pilot signal and a reference signal REF. In the thus constructed distortion compensation loop L2, to cancel distortion by coupling a pilot signal from the delay line D2 and a pilot signal from the auxiliary amplifier A2 together, an output signal from the synchronous detector 138 adjusts and controls the amplitude attenuation G2 in the variable attenuator ATT2 and the phase shift θ2 in the variable phase shifter PS2 to optimum values.

With the circuit constructed as described above, an FF amplifier can be actualized which is suitable for amplification of a multicarrier signal.

However, in the conventional example shown in FIG. 8, only one pilot signal is used, which has a frequency located a certain distance above or below the band in which the amplifier is operated. Accordingly, if the pilot signal has a frequency located above the operating band, the capability of removing or suppressing distortion in this frequency or frequencies located close thereto is optimized, whereas for a frequency band located below the band in which the amplifier is actually operated, the capability of removing or suppressing distortion is not always optimized. Thus, it has been desired to use both a pilot signal having a frequency located below the operating band and a pilot signal having a frequency located above the operating band.

Furthermore, according to an example of a conventional configuration such as the one shown in FIG. 8, an output signal from the distortion compensation loop L2 is supplied from a directional coupler DC4 to a band-pass filter BPF3 to extract only a pilot signal therefrom, which is then fed to the synchronous detector 38 as an error signal ERR. However, the output signal taken out from the directional coupler DC4 contains an amplified carrier signal in spite of the cancellation in hybrid HYB2. A filter with a very steep characteristic is required to remove this carrier signal component to extract a weak pilot signal. However, implementation of such a filter requires the physical size thereof to be increased, thereby making it difficult to miniaturize the circuit.

Further, to avoid this problem, it is contemplated that an output signal from the distortion compensation loop L2 may be down-converted so as to have a frequency in an IF band before filtering. However, this requires extra oscillators such as a local oscillator for down conversion and an IF local oscillator, thereby increasing the scale of the circuit.

SUMMARY OF THE INVENTION

In view of these problems, it is an object of the present invention to provide a feedforward distortion compensation amplifier or a control circuit or method for a feedforward distortion compensation amplifier which require a reduced number of oscillators and which enable optimization of distortion suppression over the entire frequency band of a multicarrier signal.

One aspect of the present invention is a method of controlling a feedforward distortion compensation amplifier comprising steps of detecting a distortion component generated in a main amplifier by coupling a signal branched from a signal input to said main amplifier and containing a plurality of carriers of different frequencies to a signal branched from an output signal from said main amplifier so that the coupling causes the carrier components to cancel each other, recoupling the signal resulting from said coupling to the output signal from said main amplifier, and adjusting an amplitude and phase of at least one of the signals to be recoupled so that distortion components cancel each other upon recoupling, wherein a first and second pilot signals obtained from a first and second pilot signal sources are inserted into the input signal to or output signal from the main amplifier, parts of the signal resulting from said recoupling are taken out through branching, and said signals taken out through branching are mixed with said first and second pilot signals, respectively, and thus down-converted to generate down convert signals so that control signals to adjust said amplitude and phase are generated according to said down convert signals.

Another aspect of the present invention is a circuit for controlling a feedforward distortion compensation amplifier comprising a distortion detection loop that detects a distortion component generated in a main amplifier by coupling a signal branched from a signal input to said main amplifier and containing a plurality of carriers of different frequencies to a signal branched from an output signal from said main amplifier so that the coupling causes the carrier components to cancel each other, a distortion compensation loop that recouples the signal resulting from said coupling to the output signal from said main amplifier, and means of adjusting an amplitude and phase of at least one of the signals to be recoupled so that distortion components cancel each other upon recoupling, wherein a first and second pilot signals obtained from a first and second pilot signal sources are inserted into the input signal to or output signal from the main amplifier, parts of the signal resulting from said recoupling are taken out through branching, and said signals taken out through branching are mixed with said first and second pilot signals, respectively, and thus down-converted to generate down convert signals so that control signals to said means are generated according to said down convert signals.

Still another aspect of the present invention is the circuit for controlling a feedforward distortion compensation amplifier, wherein said signal taken out through branching is passed through a predetermined frequency band to obtain a first pilot signal component that contains said first pilot signal but does not contain said second signal, and said first pilot signal component is mixed with said second pilot signal and thus down-converted to obtain a first down convert signal having a frequency amounting to a difference between a frequency of said first pilot signal and a frequency of said second pilot signal, and said signal taken out through branching is passed through another predetermined frequency band to obtain a second pilot signal component that-contains said second pilot signal but does not contain said first signal, and said second pilot signal component is mixed with said first pilot signal and thus down-converted to obtain a second down convert signal having a frequency amounting to said difference.

Yet still another aspect of the present invention is the circuit for controlling a feedforward distortion compensation amplifier, wherein said signal taken out through branching is passed through said predetermined frequency band to obtain a first pilot signal component that contains said first pilot signal but does not contain said second signal, and said first pilot signal component is orthogonally mixed with said second pilot signal and thus down-converted to obtain a set of first down convert signals having a frequency amounting to a difference between a frequency of said first pilot signal and a frequency of said second pilot signal as well as quadrature phases, and said signal taken out through branching is passed through said another predetermined frequency band to obtain a second pilot signal component that contains said second pilot signal but does not contain said first signal, and said second pilot signal component is orthogonally mixed with said first pilot signal and thus down-converted to obtain a set of second down convert signals having a frequency amounting to said difference as well as quadrature phases.

Still yet another aspect of the present invention is the circuit for controlling a feedforward distortion compensation amplifier, wherein said first down convert signal and/or said second down convert signal is synchronously detected to generate said control signal using a signal for synchronized detection of the difference between the frequency of said first pilot signal and the frequency of said second pilot signal, the synchronized detection signal supplied by synchronized detection signal generating means of generating the synchronized detection signal using said first pilot signal and said second pilot signal.

A further aspect of the present invention is the circuit for controlling a feedforward distortion compensation amplifier, wherein said set of first down convert signals having quadrature phases and/or said set of second down convert signals having quadrature phases are synchronously detected to generate said control signal using a signal for synchronized detection of the frequency difference between the frequency of said first pilot signal and the frequency of said second pilot signal, the synchronized detection signal supplied by synchronized detection signal generating means of generating the synchronized detection signal using said first pilot signal and said second pilot signal.

A still further aspect of the present invention is the circuit for controlling a feedforward distortion compensation amplifier, wherein a signal obtained by synthesizing in-phase components of said set of first down convert signals having quadrature phases and of said set of second down convert signals having quadrature phases, and a signal obtained by synthesizing quadrature components of said set of first down convert signals having quadrature phases and of said set of second down convert signals having quadrature phases are each synchronously detected to generate said control signal using a signal for synchronized detection of the frequency difference between the frequency of said first pilot signal and the frequency of said second pilot signal, the synchronized detection signal is supplied by synchronized detection signal generating means of generating the synchronized detection signal using said first pilot, signal and said second pilot signal.

A yet further aspect of the present invention is the circuit for controlling a feedforward distortion compensation amplifier, wherein said set of first down convert signals having quadrature phases and/or said set of second down convert signals having quadrature phases are respectively level detected to generate said control signal.

A still yet further aspect of the present invention is a circuit for controlling a feedforward distortion compensation amplifier, wherein said synchronized detection signal generating means mixes said first pilot signal and said second pilot signal together, allows passage of a part of said mixed signal which has a frequency amounting the difference between the frequency of said first pilot signal and the frequency of said second pilot signal, and distributes the signal obtained to a plurality of paths.

An additional aspect of the present invention is the circuit for controlling a feedforward distortion compensation amplifier, wherein said first down covert signal and said second down convert signal are alternately switched to be detected.

A still additional aspect of the present invention is the circuit for controlling a feedforward distortion compensation amplifier, wherein time for detection using said first down convert signal and time for detection using said second down convert signal are determined by weighting.

A yet additional aspect of the present invention is the circuit for controlling a feedforward distortion compensation amplifier, wherein the frequencies of said first and second pilot signals are determined on the basis of all of said carriers, and said weighting is determined on the basis of those of all of said carriers which are actually used.

A still yet additional aspect of the present invention is the circuit for controlling a feedforward distortion compensation amplifier, wherein elements constituting oscillators for said first and second pilot signal source, elements constituting a band-pass filter that takes out said first pilot signal by passing the signal therethrough, and elements constituting a band-pass filter that takes out said second pilot signal by passing the signal therethrough have substantially the same temperature characteristic.

A supplementary aspect of the present invention is the circuit for controlling a feedforward distortion compensation amplifier, wherein elements constituting oscillators for said first and second pilot signal source, elements constituting a band-pass filter that takes out said first pilot signal by passing the signal therethrough, and elements constituting a band-pass filter that takes out said second pilot signal by passing the signal therethrough are installed on ovens subjected to the same temperature control.

A still supplementary aspect of the present invention is a feedforward distortion compensation amplifier, comprising:

a distortion detection loop that detects a distortion component generated in a main amplifier by coupling a signal branched from a signal input to said main amplifier and containing a plurality of carriers of different frequencies to a signal branched from an output signal from said main amplifier so that the coupling causes the carrier components to cancel each other;

a distortion compensation loop that recouples the signal resulting from said coupling to the output signal from said main amplifier; and means of adjusting an amplitude and phase of at least one of the signals to be recoupled so that distortion components cancel each other upon recoupling, wherein the amplifier comprises the circuit controlling a feedforward distortion compensation amplifier.

DESCRIPTION OF SYMBOLS

11, 12, 13 Directional couplers
14 Vector adjustor
15 Variable vector adjustors
16, 17 Amplifiers
18, 19 Delay lines
20 Control circuit
21 to 25 Directional couplers
26, 27 Pilot signal sources
28, 29 Phase shifters
31, 32, 33 Mixers
35, 36 Quadrature mixers
37, 38 Combiners
39, 40 Level converters
41, 42 Band-pass filters
43, 44, 45 IF filters
51, 52 Dividers

PREFERRED EMBODIMENTS OF THE INVENTION

Embodiments of the present invention will be described below with reference to the drawings.

(Embodiment 1)

Figure 1:
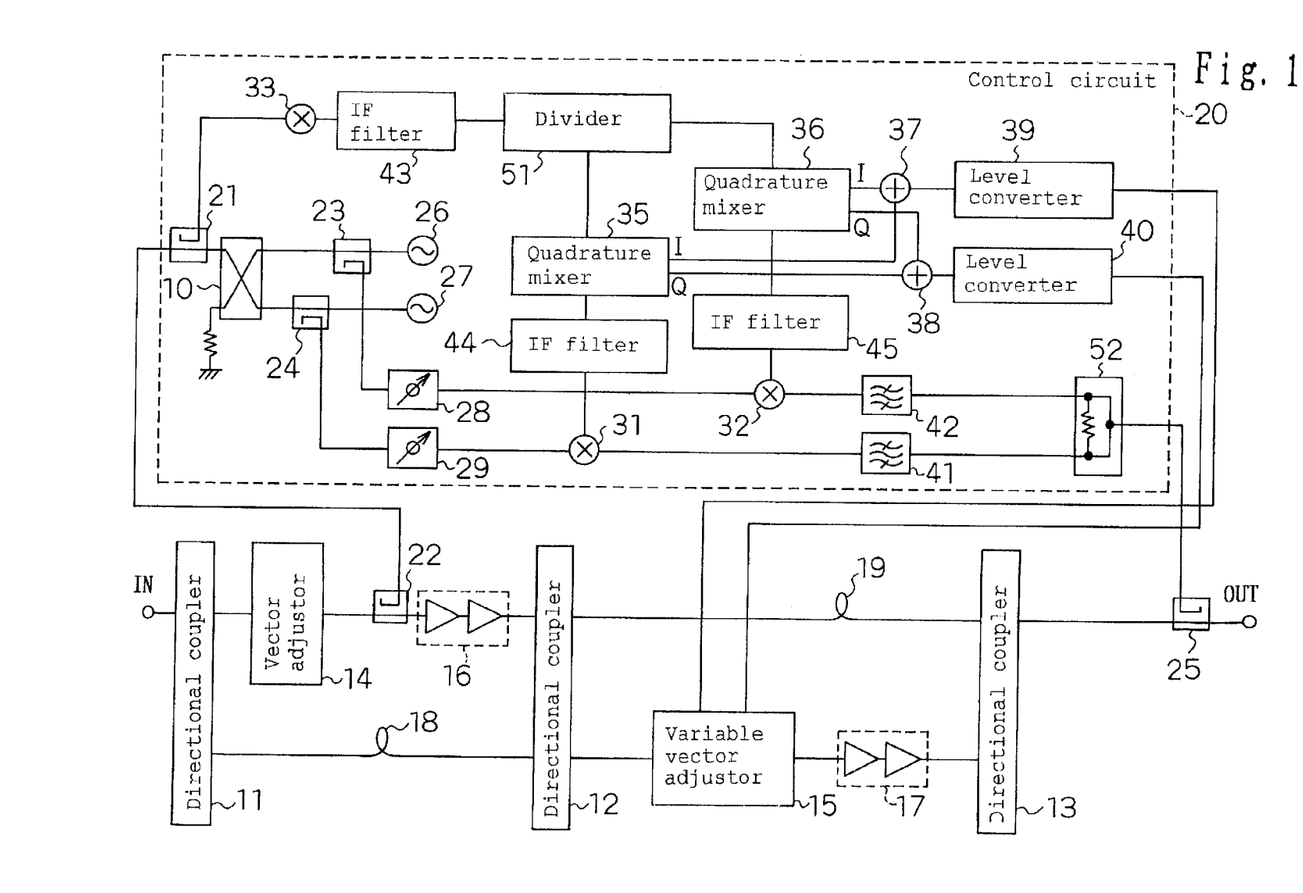
FIG. 1 is a diagram showing a configuration of a circuit according to Embodiment 1 of the present invention.

FIG. 1 shows a configuration of a circuit according to Embodiment 1 of the present invention. In FIG. 1, when a signal, for example, a multicarrier signal is applied to a directional coupler 11 through an input end IN, it is branched into two by the directional coupler 11. One of the branched signals is input to a vector adjustor 14, which then adjusts the amplitude and phase of this signal. The adjusted signal is then amplified by a main amplifier 16. The signal amplified by the main amplifier 16 is input to a directional coupler 13 via a directional coupler 12 and a delay line 19. Furthermore, the directional coupler 13 outputs the signal to the following circuit via a signal output end OUT.

The other of the signals branched by the directional coupler 11 is input to the directional coupler 12 via a delay line 18. The delay line 18 compensates for a signal delay that may occur on a path from the signal branching point at the directional coupler 11 through the main amplifier 16 to the signal synthesis point at the directional coupler 12.

The directional coupler 12 branches a signal output by the main amplifier 16 and containing distortion, into two. One of the branched signals is supplied to the delay line 19, whereas the other signal is coupled to the signal from the delay line 18. This coupling causes carrier components to cancel each other to take out a distortion component. This cancellation is achieved by the vector adjustor 14 by adjusting the amplitude and phase of one of the signals branched by the directional coupler 11. In this manner, a distortion detection loop is composed of the directional coupler 11 the vector adjustor 14, the amplifier 16, the directional coupler 12, and the delay line 18.

The signal resulting from the coupling is input through the directional coupler 12 to a variable vector adjustor 15, which then adjusts the amplitude and phase of the signal. The adjusted signal is then amplified by an auxiliary amplifier 17. The signal amplified by the auxiliary amplifier 17 is input to the directional coupler 13. The signal input to the directional coupler 13 is coupled by the directional coupler 13 to a signal also input thereto via the delay line 19 (cancellation of a distortion component), and the signal obtained is output from the signal output end OUT. In this manner, a distortion compensation loop is composed of the directional coupler 12, the vector adjustor 15, the amplifier 17, the directional coupler 13, and the delay line 19.

In the present invention, the cancellation of the distortion component can be achieved by causing the control circuit 20 to insert and detect two pilot signals. In the prior art, one pilot signal is used to provide this function, whereas in the present invention, two pilot signals are used. The present method will be described below.

The control circuit 20 has a pilot signal source 26 that originates a pilot signal $f_{p1}$ and a pilot signal source 27 that originates a pilot signal $f_{p2}$ so that a first pilot signal from the pilot signal source 26 and a second pilot signal from the pilot signal source 27 are each applied to the hybrid 10. Both pilot signals applied to the hybrid 10 are coupled together inside the hybrid 10, output, and then inserted via a directional coupler 22 into a signal input to the directional coupler 12 for superimposition.

On the other hand, the first and second pilot signals coupled together in the hybrid 10 are taken out by a directional coupler 21 and applied to a mixer 33. For example, the mixer 33 that uses the 2nd order nonlinearity characteristic of diodes outputs a dc component and a sum and difference beat signal components from the input two pilot signals, to an IF filter 43. The IF filter 43 takes out only the difference beat signal, i.e. a signal beaten down (down-converted) so as to have what is called an intermediate frequency, and outputs it to a divider 51.

The first and second pilot signals inserted into and superimposed on the input multicarrier signal as described above are input, from one of the output ends of the directional coupler 12, to the directional coupler 13 via the delay line 19 together with carrier signals amplified by the main amplifier 16 as described above, and are also fed, from the other output end thereof, to the directional coupler 13 via the variable vector adjustor 15 and the auxiliary amplifier 17 as a signal with the carrier components mutually cancelled.

An output signal from the directional coupler 13 is extracted by a directional coupler 25 and is branched into two by a divider 52. The two signals are fed to band-pass filters 41 and 42, respectively. Here, the band-pass characteristic of the band-pass filter 41 is set so as to pass the first pilot signal there through while inhibiting the second pilot signal from passing, whereas the band-pass characteristic of the band-pass filter 42 is set so as to pass the second pilot signal there through while inhibiting the first pilot signal from passing. Consequently, a first pilot signal component containing the first pilot signal is fed to one of the input ends of a mixer 31 as an output signal from the band-pass filter 41. The second pilot signal, extracted from the second pilot signal source 27 by a directional coupler 24 and having its phase adjusted by a phase shifter 29, is applied to the other input end of the mixer 31. Similarly, a second pilot signal component containing the second pilot signal taken out from the band-pass filter 42 is applied to one of the input ends of a mixer 32, whereas the first pilot signal, extracted from the first pilot signal source 26 by a directional coupler 23 and having its phase adjusted by a phase shifter 28, is applied to the other input end thereof.

As a result, the mixer 31 mixes together the first pilot signal component input by the band-pass filter 41 and the second pilot signal input via the phase shifter 29 and outputs the mixed signal to an IF filter 44. Likewise, the mixer 32 mixes together the second pilot signal component input by the band-pass filter 42 and the first pilot signal input via the phase shifter 28 and outputs the mixed signal to an IF filter 45. The IF filters 44 and 45 take out signals (a first and second down convert signals) beaten down so as to have a frequency corresponding to a difference between the frequencies of the first and second pilot signals, i.e. an intermediate frequency, from the mixed output signals supplied by the mixers 31 and 32, respectively, and output each of the taken-out signals to one of the input ends of a corresponding one of quadrature mixers 35 and 36.

Signals beaten down so as to have the intermediate frequency of the first and second pilot signals as described previously are each applied to the other input end of the corresponding one of the quadrature mixers 35 and 36 from the divider 51. As a result, the quadrature mixer 35 orthogonally mixes together the signals fed through these input ends, and outputs an in-phase (I) and quadrature-phase (Q) output signals to combiners 37 and 38. Similarly, the I output signal from the quadrature mixer 36 is applied to the combiner 37, with the Q output signal applied to the combiner 38 via a low-pass filter (not shown) In this manner, information on the amplitude and phase of the first pilot signal component thus taken out from the band-pass filter 41 and converted so as to have the intermediate frequency is contained in the I and Q output signals from the quadrature mixer 35. Likewise, information on the amplitude and phase of the second pilot signal component thus taken out from the band-pass filter 42 is contained in the I and Q output signals from the quadrature mixer 36.

The I output signals from the quadrature mixers 35 and 36 are added together at the combiner 37, and the added-together signal has its level converted by a level converter 39. The signal thus obtained is fed to the variable vector adjustor 15 for amplitude adjustment. Similarly, the Q output signals from the quadrature mixers 35 and 36 are added together at the combiner 38, and the added-together signal has its level converted by a level converter 40. The signal thus obtained is fed to the variable vector adjustor 15 for amplitude adjustment.

The variable vector adjustor 15 controls the vector of the signals fed by the directional coupler 12 (amplitude and phase) so that the output signals to the combiners 37 and 38 are minimized (zeroed), thereby minimizing the pilot signal contained in the output signal from the directional coupler 13.

In this manner, the control circuit for the FF amplifier according to the present invention can remove distortion resulting from the nonlinearity of the FF amplifier using two pilot signals located outside and appropriately close to the respective frequencies located above and below the frequency band of a multicarrier signal to be FF-amplified.

Figure 2:
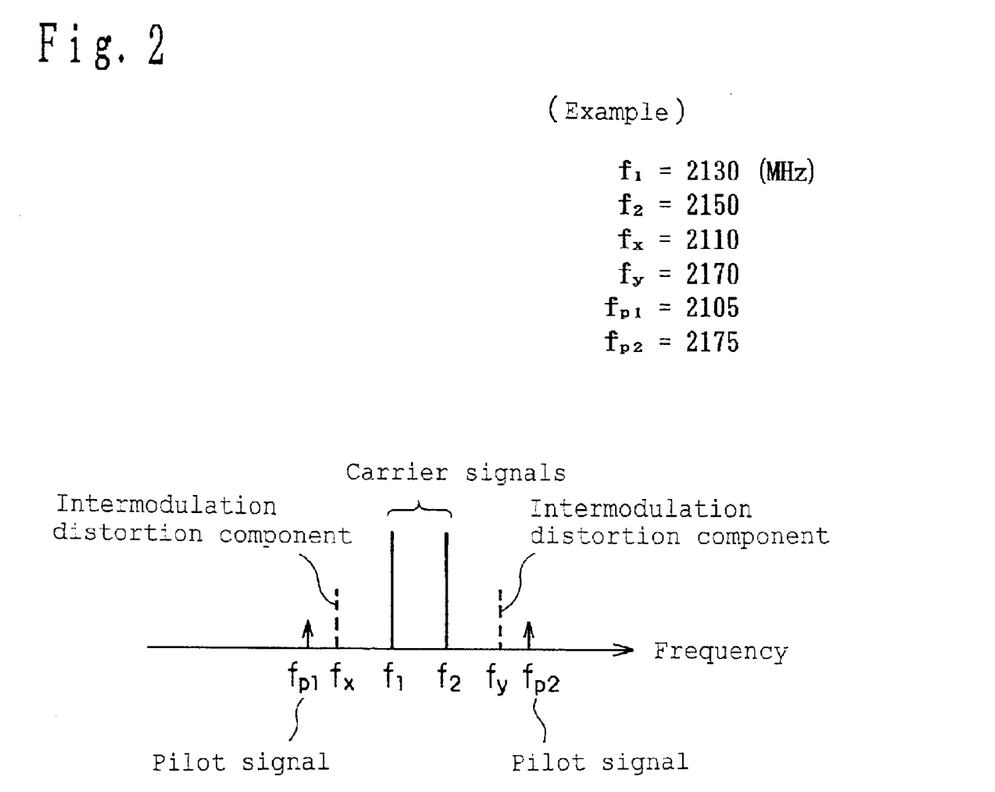
FIG. 2 is a diagram showing a frequency spectra of carrier signals, distortion components, and pilot signals, the diagram being used to describe the operations and functions of circuits according to Embodiments 1 to 3.

Now, to allow the reader to easily understand the operations and functions of the control circuit according to the present invention, two carrier signals are taken by way of example for simplification to describe the relationship between the carrier signals and two pilot signals using the spectrum diagram in FIG. 2.

In FIG. 2, $f_1$ and $f_2$ denote the frequencies of two carriers, and $f_x$ and $f_y$ denote the frequencies of those (intermodulation distortion components) of the distortion components resulting from intermodulation of the two carriers which are closest to the carrier frequencies. Furthermore, the frequencies of pilot signals that compensate for these distortion components are located outside the frequencies of the distortion components and denoted by $f_{p1}$ and $f_{p2}$.

As well-known, if nonlinear distortion occurs in an amplifier, relatively high-order nonlinear distortion may occur. However, 2nd- and 3rd-order distortion components have only to be considered in a practical sense, so that the relationship between the voltage (e) of an input signal to the amplifier and the voltage (E) of an output signal therefrom is given by the following equation:

$$E = K_1 e + K_2 e^2 + K_3 e^3 \quad \text{(Equation 1)}$$

where $K_n$ denotes a coefficient representing a linearity of the amplifier.

Now, it is assumed that a signal with two frequency components is applied to the input of the amplifier as shown in the following equation:

$$e = A \cos \omega_1 t + B \cos \omega_2 t \quad \text{(Equation 2)}$$

where $\omega_1 = 2\pi f_1$ and $\omega_2 = 2\pi f_2$.

When (Equation 2) is substituted into (Equation 1) and the resulting equation is then expanded, an intermodulation distortion component such as the one shown below is obtained from the 3rd distortion.

$$\tfrac{3}{4}[K_3 A^2 B \cos(2\omega_1 \pm \omega_2)t] \text{ and}$$

$$\tfrac{3}{4}[K_3 B^2 A \cos(2\omega_2 \pm \omega_1)t]$$

Accordingly, those of these four intermodulation distortion components which are closest to the carrier frequencies $f_1$ and $f_2$ are expressed by $f_x = (2f_1 - f_2)$ and $f_y = (2f_2 - f_1)$.

For example, if it is assumed that $f_1 = 2130$ (MHz) and $f_2 = 2150$ (MHz), the intermodulation distortion components are $f_x = 2110$ (MHz) and $f_y = 2170$ (MHz) as shown in FIG. 2. Consequently, the pilot frequencies are selected to have a frequency $f_{p1}$ of 2105 (MHz), located outside the frequency $f_x$, and a frequency $f_{p2}$ of 2175 (MHz), similarly located outside the frequency $f_y$. Using the frequencies of the pilot signals, the operation of the control circuit 20 in FIG. 1, described previously, will be described in further detail.

That is, it is assumed that in FIG. 2, the pilot signal source 26 has a pilot signal frequency of 2105 (MHz) and the pilot signal source 27 has an oscillation frequency of 2175 (MHz). As described above, a signal beaten down so as to have a frequency of 70 MHz via the IF filter 43 is divided into two by the divider 51 and then supplied to the quadrature mixers 35 and 36.

On the other hand, a signal is extracted by the directional coupler 25 and divided into two by the divider 52, with the two signals applied to the band-pass filters 41 and 42, respectively.

The band-pass filter 41 passes the pilot signal with the frequency $f_{p1} = 2105$ (MHz) (first pilot signal component) therethrough so that the signal is output to one of the input ends of the mixer 31. Since the pilot signal extracted by the directional coupler 24 and with the frequency $f_{p2} = 2175$ (MHz) is input to the other input end of the mixer 31 via the phase shifter 29, the signals supplied through these input ends are mixed together in the mixer 31 to form a beat signal, which is then output to the IF filter 44.

The IF filter 44 allows the passage of a difference beat signal of the input signal, i.e. a signal beaten down so as to have the intermediate frequency of 70 (MHz) so that the difference beat signal is input to one of the input ends of the quadrature mixer 35. Accordingly, the pilot signal component with the frequency $f_{p1}$ obtained via the band-pass filter 41 after extraction by the directional coupler 25 is down-converted so as to have the intermediate frequency and is then applied to the quadrature mixer 35.

Since the signal with the difference frequency (70 (MHz)) of the two pilot signals is provided from the divider 51 to the other input end of the quadrature mixer 35 as described previously, the mixer 35 executes a process such as synchronized detection or squared detection to output, as I and Q output signals, information on the amplitude and phase of the pilot signal component with the frequency $f_{p1}$ contained in the output signal extracted by the directional coupler 25 as described above.

Similarly, the pilot signal component with the frequency $f_{p2}$ obtained via the band-pass filter 42 after extraction by the directional coupler 25 is mixed in the mixer 32 with the pilot signal with the frequency $f_{p1}$ extracted by the directional coupler 23 and provided via the phase shifter 28. As a result, the pilot signal component with the frequency $f_{p2}$ beaten down (down-converted) so as to have the intermediate frequency (70 (MHz)) is taken out via the IF filter 45 and fed to the quadrature mixer 36. The operations and functions of the quadrature mixer 36 are similar to those of the quadrature mixer 35. That is, the mixer 36 outputs, as I and Q output signals, information on the amplitude and phase of the pilot signal component with the frequency $f_{p2}$ contained in the output signal extracted by the directional coupler 25.

The subsequent operations performed after the quadrature mixers have already been described, and description thereof is thus omitted.

(Embodiment 2)

Figure 3:
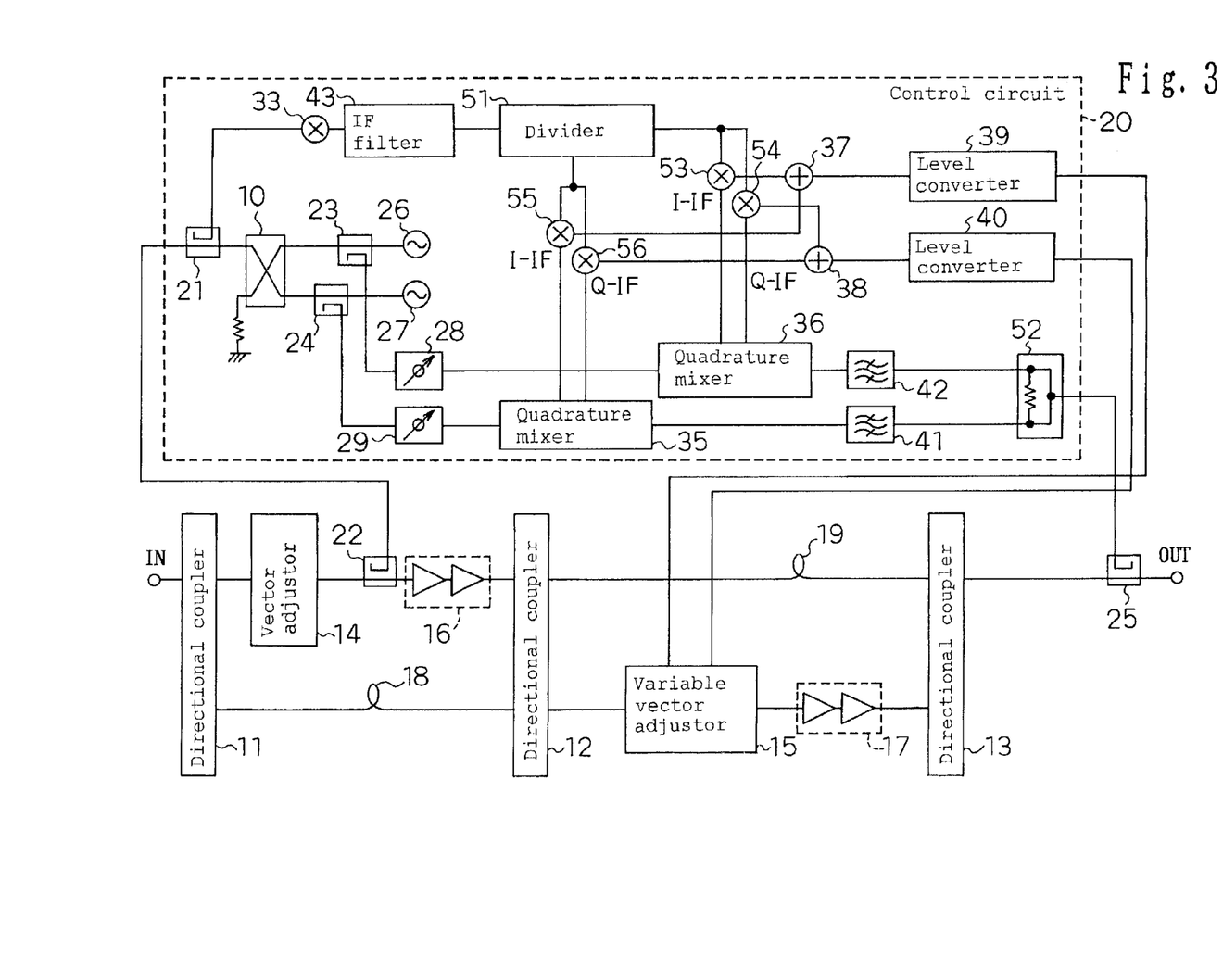
FIG. 3 is a diagram showing a configuration of the circuit according to Embodiment 2 of the present invention.

FIG. 3 shows a configuration of a circuit according to Embodiment 2 of the present invention. Building blocks in FIG. 3 which are similar or correspond to those in the circuit of Embodiment 1 are denoted by the same reference numerals, and description thereof is omitted.

As in Embodiment 1, a signal output by the directional coupler 13 in FIG. 3 is supplied via the directional coupler 25 to the divider 52, which then divides the signal into two and outputs the signals obtained to the band-pass filters 41 and 42, respectively. As described in Embodiment 1, the band-pass filter 41 allows the passage of that pilot signal component with the frequency $f_{p1}$ (first pilot signal component) from the signal input there to which is output from the first pilot signal source 26 so that the pilot signal component is applied to one of the input ends of the quadrature mixer 35. Likewise, the band-pass filter 42 allows the passage of that pilot signal component with the frequency $f_{p2}$ (second pilot signal component) which is output from the second pilot signal source 27 so that the pilot signal component is applied to one of the input ends of the quadrature mixer 36.

In the quadrature mixer 35, the pilot signal component with the frequency $f_{p1}$ input by the band-pass filter 41 is orthogonally mixed with a second pilot signal with the frequency $f_{p2}$, which has been taken out by the directional coupler 24 and then has its phase adjusted by the phase shifter 29. The quadrature mixer 35 provides in-phase (I) and quadrature-phase (Q) output signal sat the output ends thereof, the output signals resulting from quadrature mixing. Although not shown, filtering the output signals to remove harmonic components therefrom results in an I output signal (I-IF) and a Q output signal (Q-IF) of the first pilot signal component (the first down-convert signal) down-converted so as to have the intermediate frequency (corresponding to the difference between the frequencies $f_{p2}$ and $f_{p1}$). These output signals are each applied to one of the input ends of a corresponding one of the mixers 55 and 56. That is, the I output signal (I-IF) and the Q output signal (Q-IF) are input to the mixers 55 and 56, respectively, as a set of first down convert signals having quadrature phases.

Similarly, in the quadrature mixer 36, the pilot signal component with the frequency $f_{p2}$ input by the band-pass filter 42 is orthogonally mixed with a first pilot signal with the frequency $f_{p1}$, which has been taken out by the directional coupler 23 fed by the other input end and then has its phase adjusted by the phase shifter 28. As in the case with the output signals from the quadrature mixer 35, this results in an I output signal (I-IF) and a Q output signal (Q-IF) of the second pilot signal component (second down convert signal) down-converted so as to have the intermediate frequency. These output signals are each applied to one of the input ends of a corresponding one of the mixers 53 and 54. That is, the I output signal (I-IF) and the Q output signal (Q-IF) are input to the mixers 53 and 54, respectively, as a set of second down convert signals having quadrature phases.

As in Embodiment 1, a signal beaten down so as to have a frequency corresponding to the difference between the first and second pilot signals $f_{p1}$ and $f_{p2}$ (intermediate frequency) has already been applied to the other input end of the mixer 55 from the divider 51 and synchronously detects the first down convert signal (I-IF) input beaten down (down-converted) so as to have the intermediate frequency as described above. Thus, the signal synchronously detected by the mixer 55 has its harmonic components removed by a filter (not shown) and is then applied to the combiner 37 as an I output signal of the first pilot signal component.

Likewise, in the mixer 56, the first down convert signal (Q-IF) of the first pilot signal component supplied by the quadrature mixer 35, the first down convert signal having been beaten down so as to have the intermediate frequency, is synchronously detected, has its harmonic components filtered and removed, and is then applied to the combiner 38 as a Q output signal. Also in the mixers 53 and 54, the second down convert signals (I-IF) and (Q-IF) obtained by beating down the second pilot signal component supplied by the quadrature mixer 36 so as to have the intermediate frequency, are synchronously detected, and are then applied to the combiners 37 and 38, respectively, as an I and Q output signals.

At the combiner 37, the I output signals of the first and second down convert signals are synthesized together, and the synthesized signal is fed back to the variable vector adjustor 15 via the level converter 39 as in Embodiment 1. Likewise, at the combiner 38, the Q output signals are synthesized together, and the synthesized signal is fed back to the variable vector adjustor 15 via the level converter 40.

As in Embodiment 1, in order to minimize the first and second pilot signals contained in the output signals from the output ends of the FF amplifier, the variable vector adjustor 15 controls the vector (amplitude and phase) of the signal supplied by the directional coupler 12 so as to minimize (zero) the output signals from the combiners 37 and 38.

Figure 4:
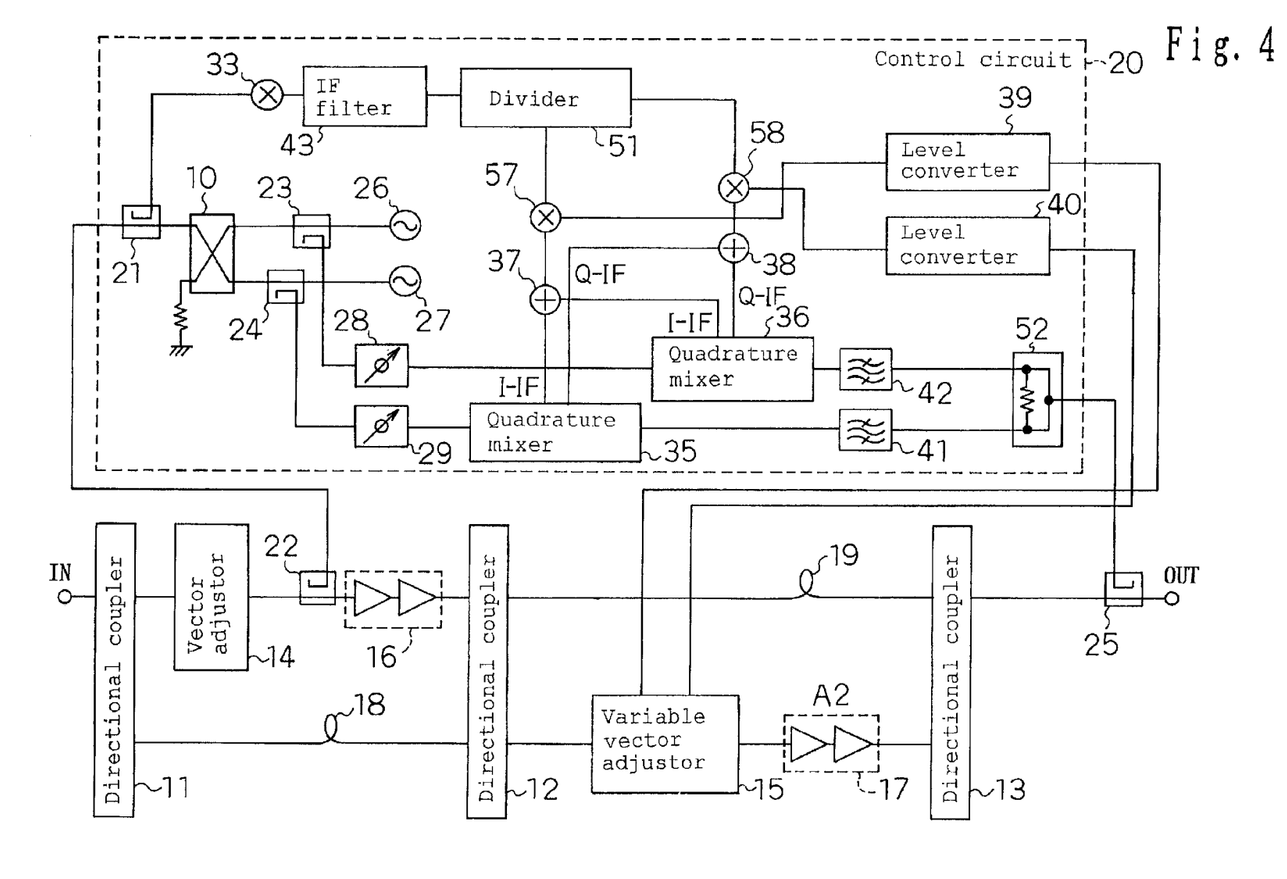
FIG. 4 is a diagram showing a configuration of the circuit according to a variation of Embodiment 2 of the present invention.

The circuit shown in FIG. 4 can be implemented as a variation of this embodiment. The circuit in FIG. 4 differs from the circuit in FIG. 3 in that the I output signal (I-IF) of the first down convert signal obtained by causing the quadrature mixer 35 to down-convert the first pilot signal component so as to have the intermediate frequency (corresponding to the difference between the frequencies $f_{p1}$ and $f_{p2}$) is synthesized together at the combiner 37 with the I output signal (I-IF) of the second down convert signal obtained by causing the quadrature mixer 36 to down-convert the second pilot signal component so as to have the intermediate frequency, while the Q output signal (Q-IF) of the first down convert signal obtained by causing the quadrature mixer 35 to down-convert the first pilot signal component so as to have the intermediate frequency is synthesized together at the combiner 38 with the Q output signal (Q-IF) of the second down convert signal obtained by causing the quadrature mixer 36 to down-convert the second pilot signal component so as to have the intermediate frequency, and in that in the mixers 57 and 58,these synthesized signals are synchronously detected using a signal beaten down so as to have a frequency (intermediate frequency) corresponding to the difference between the frequencies $f_{p1}$ and $f_{p2}$ of the first and second pilot signals. The other operations of this circuit are similar to those of the circuit in FIG. 3.

While the circuit in FIG. 3 requires four mixers for synchronously detecting the signals I-IF and Q-IF, the circuit in FIG. 4 requires only two mixers. That is, this circuit configuration enables reduction of the number of mixers required for synchronized detection.

The circuit of Embodiment 2 simplifies the detection process because the signals have quadrature phases.

(Embodiment 3)

Figure 5:
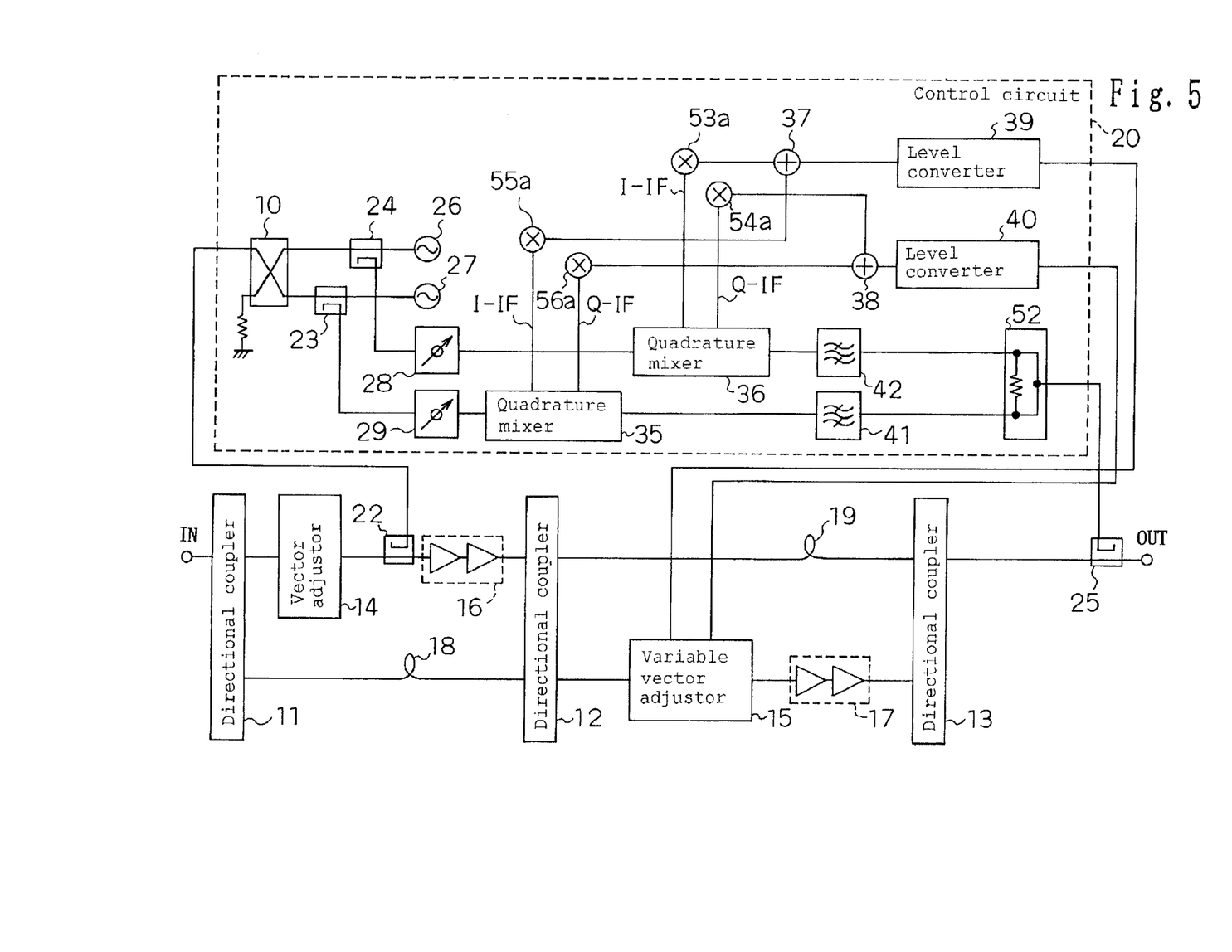
FIG. 5 is a diagram showing a configuration of the circuit according to Embodiment 3 of the present invention.

FIG. 5 shows a configuration of a circuit according to Embodiment 3 of the present invention. Building blocks in FIGS. 1 and 3 which are similar or correspond to those in the circuit of Embodiments 1 and 2 are denoted by the same reference numerals, and description thereof is omitted.

As in Embodiment 2, in the circuit shown in FIG. 5, an output signal from the directional coupler 13 is applied via the directional coupler 25 to the divider 52, which then divides the signal into two and outputs the signals obtained to the band-pass filters 41 and 42, respectively. The band-pass filter 41 allows the passage of a first pilot signal component with the frequency $f_{p1}$ from the signal input thereto so that the first pilot signal component is applied to one of the input ends of the quadrature mixer 35.

The quadrature mixer 35 orthogonally mixes the first pilot signal component with a second pilot signal with the frequency $f_{p2}$ input through the other end thereof and then outputs an in-phase (I) and quadrature-phase (Q) mixing output signals. These mixing output signals are passed through a filter (not shown) to remove harmonic components therefrom to obtain an I signal (I-IF) and a Q signal (Q-IF) of a first down convert signal obtained by down-converting the first pilot signal component so as to have the intermediate frequency (corresponding to the difference between the frequencies $f_{p1}$ and $f_{p2}$). The I and Q signals are then applied to detector mixers 55a and 56a for level detection.

Likewise, the quadrature mixer 36 orthogonally mixes the first pilot signal with a second pilot signal component with the frequency $f_{p2}$ passed through the band-pass filter 42. Thus, an I signal (I-IF) and a Q signal (Q-IF) of a second down convert signal obtained by down-converting the second pilot signal component so as to have the intermediate frequency are also obtained and then applied to detector mixers 53a and 54a for level detection.

The I signal (I-IF) of the first pilot signal component having its level detected by the detector mixer 53a is processed by a low-pass filter (not shown) and then applied to the combiner 37 as an I signal. Similarly, the I signal (I-IF) of the second pilot signal component having level detected by the detector mixer 53a is processed by a low-pass filter and then applied to the combiner 37 as an I signal. The I signals thus processed by the low-pass filters are synthesized together at the combiner 37.

Likewise, the Q signals of the first and second pilot signal components having level detected by the detector mixers 56a and 54a, respectively, and processed by low-pass filters are applied to the combiner 38, where the Q signals are synthesized together.

The functions and operations performed after the combiners are similar to those in Embodiments 1 and 2, described previously, and description thereof is thus omitted. The detection mixers 53a to 56a may be 2nd-order nonlinear detectors, envelope detectors, or linear detectors. In this case, as shown in FIG. 5, the mixer 33, IF filter 43, and divider 51, shown in FIG. 1 or 2, may be omitted.
(Embodiment 4)

In the description of the control circuits of the above described embodiments of the present invention, both first and second down convert signals are detected and thus have their levels converted before the resultant signals are introduced into the variable vector adjustor 14. However, a switching operation may be performed to alternately detect the first and second down convert signals and thus have their levels converted before the resultant signals are introduced in to the variable vector adjustor 14. Such an example is shown in FIG. 6 as Embodiment 4.

Figure 6:
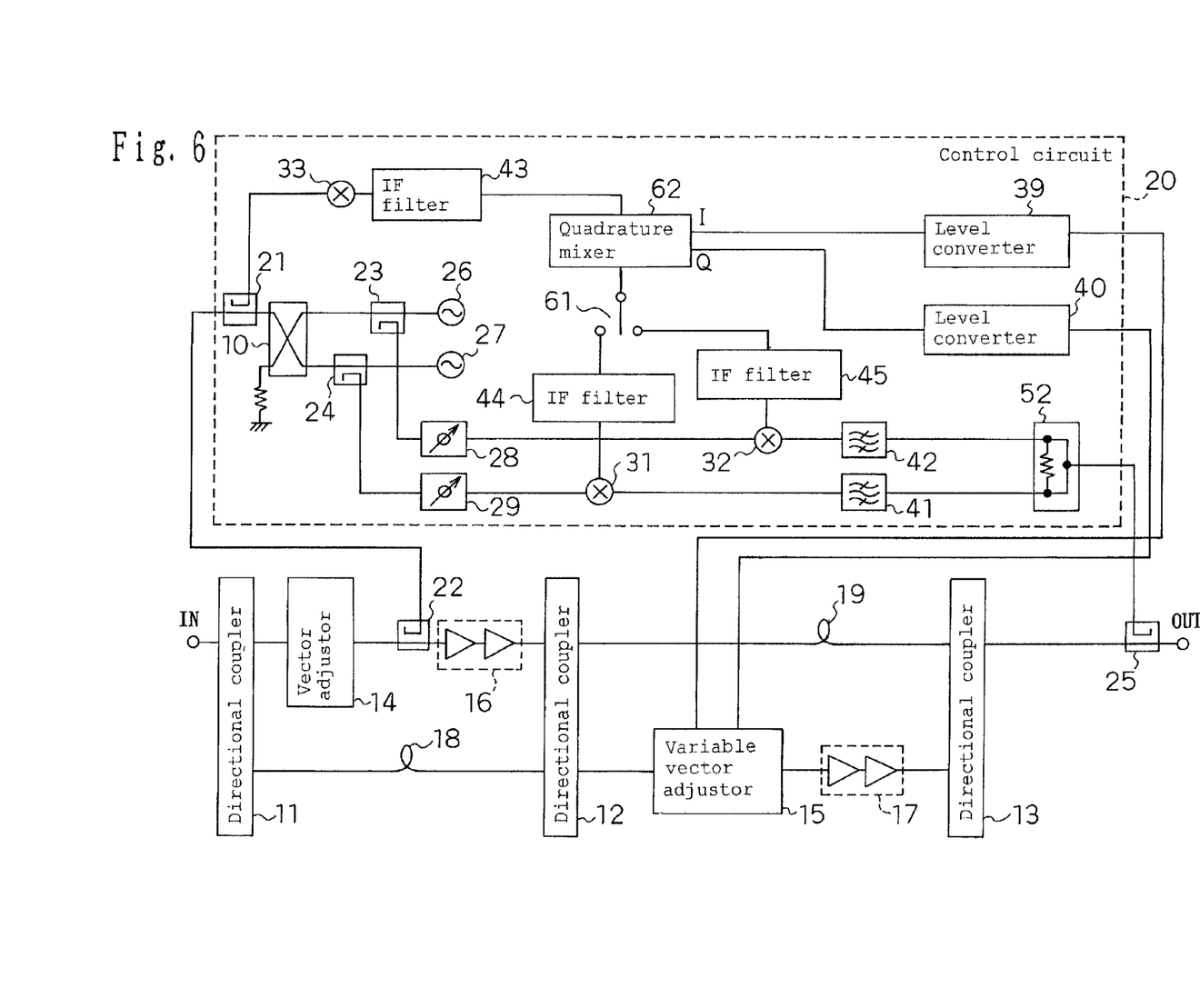
FIG. 6 is a diagram showing a configuration of the circuit according to Embodiment 4 of the present invention.

The circuit configuration shown in FIG. 6 is a variation of the circuit configuration shown in FIG. 1. Arrangements similar or corresponding to those in the circuit shown in FIG. 1 are denoted by the same reference numerals, and description thereof is thus omitted. In the circuit configuration shown in FIG. 6, the divider 51 and combiners 37 and 38 are omitted, and a quadrature mixer 62 is used in place of the quadrature mixers 35 and 36. The quadrature mixer 62 is connected to an output end of a switch 61, and one of two input ends of the switch 61 is connected to output side of the IF filter 44, the other of the two input ends is connected to an output side of the IF filter 45. In this case, a semiconductor type switch is used as the switch 61. The output sides of the quadrature 62 is connected to level converters 39 and 40.

Next, the operation of the circuit constructed as described above will be described below.

The switch 61 first connects the IF filter 44 and the quadrature mixer 62 together, and the quadrature mixer 62 detects a first down convert signal. After a predetermined time has elapsed, the switch 62 switches the connection so that the IF filter 45 and the quadrature mixer 62 are connected together, and the quadrature mixer 62 detects a second down convert signal. Subsequently, after the predetermined time has elapsed, the switch 61 connects the IF filter 44 and the quadrature mixer 62 together again, and the quadrature mixer 62 detects a first down convert signal. The switch 61 repeats the above operation to successively choose first and second down convert signals, and the quadrature mixer 62 alternately detects the first and second down convert signals.

At this time, if the switch 61 can operate at sufficiently high speeds and alternate between the first and second down convert signals, effects similar to those of the circuits described in Embodiments 1 to 3 can be produced. Further, according to this circuit configuration, compared to the circuits constructed as described in Embodiments 1 to 3, the number of quadrature mixers is reduced to eliminate the needs for the divider 51 and combiners 37 and 38, thereby further reducing the size of the circuit.

In the above description, the switch 61 switches between the first and second down convert signals so that the period during which the first down convert signal is chosen is the same as the period during which the second down convert signal is chosen. However, the switch 61 may switch between the first and second down convert signals so that the period during which the first down convert signal is chosen is different from the period during which the second down convert signal is chosen. That is, the switch 61 may perform such a switching operation that each period during which the first or second down convert signal is chosen is weighted. Such a case will be described below.

Figure 7:
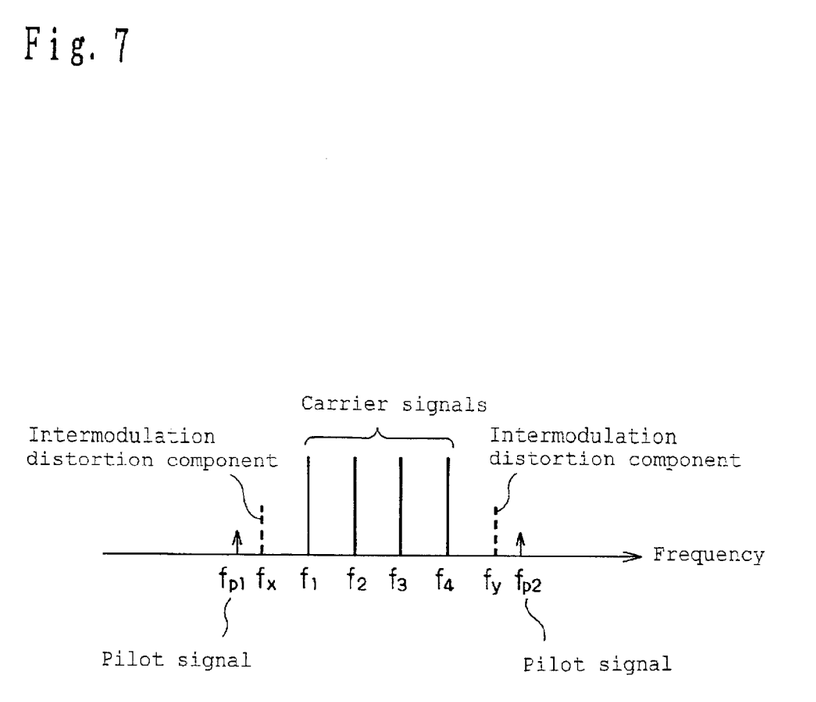
FIG. 7 is a diagram showing the frequency spectra of carrier signals, distortion signals, and pilot signals, the diagram being used to describe the operations and functions of the circuit according to Embodiment 4.

FIG. 7 shows a spectra of intermodulation distortions and pilot signals in the case where four carriers spaced at uniform intervals are used. In this drawing, $f_1$, $f_2$, $f_3$, and $f_4$ ($f_1 < f_2 < f_3 < f_4$) denote the frequencies of the four carriers, and $f_x$ and $f_y$ denote the frequencies of those (intermodulation distortion components) of the distortion components resulting from intermodulation of the four carriers which are closest to the carrier frequencies, as described above. Furthermore, the frequencies of the pilot signals, which compensate for these distortion components, are determined by the frequencies $f_1$, $f_2$, $f_3$, and $f_4$ of the four carriers as described above, and are shown in FIG. 7 as $f_{p1}$ and $f_{p2}$, located outside the distortion components.

For example, in the case of a base station that selects and uses two of the four carriers, the frequencies of the distortion components closest to the carriers may deviate from the frequencies $f_x$ and $f_y$, determined as described above depending on how to select two carriers between the four carriers. In this case, the switch 61 performs a switching operation by weighting each period during which the first or second down convert signal is chosen, depending on the amount of deviation. That is, the desired ratio with which each distortion component is suppressed is determined depending on the amount of deviation, and switching periods are set so that the switch 61 performs such a switching operation that the suppression ratio equals the ratio of the sum of the periods during which the first down convert signal is chosen to the sum of the periods during which the second down convert signal is chosen. For example, if the desired suppression ratio for each distortion component is 7:3, the switch 61 performs such a switching operation that the ratio of the sum of the periods during which the first down convert signal is chosen to the sum of the periods during which the second down convert signal is chosen is 7:3. At this time, in the case of Wideband CDMA base stations, the switch 61 must perform at a speed sufficiently higher than 300 μsec, which amounts to the period of power control. Then, the distortion components located close to the carriers can be effectively removed even if the frequencies thereof deviate from the frequencies $f_x$ and $f_y$ according to the ways selecting carriers.

In the example shown in FIG. 7, the four carriers are shown to be spaced at uniform intervals, however, they may be spaced at nonuniform intervals. In this case, the frequencies of the distortion components closest to the carriers deviate from the frequencies $f_x$ and $f_y$, determined in the case where the four carriers spaced at uniform intervals are used. Then, as described above, the switch 61 performs a switching operation according to periods for the first and second down convert signals which are weighted depending on the amount of deviation.

Further, the carriers may be biased toward the low or high frequency side within the operating band. In such a case, the switch 61 performs a switching operation at the desired suppression ratio as described above, thereby producing effects similar to those described above.

Furthermore, in the description of this embodiment, the switch 61 performs periodic switching operations. However, for some base stations, only the distortion components located at one side of the carriers are important. In this case, the switch 61 may choose only one of the first and second down convert signals.

Moreover, in the description of this embodiment, the switch 61 is introduced into the circuit shown in FIG. 1 to switch between the first and second down convert signals. However, switching means may be introduced into the circuits in FIGS. 3 and 5 to switch between the first and second down convert signals. In this case, each of the (I-IF) and (Q-IF) signals must be switched between the first and second convert signals, so that the switching means is composed of a linked switch (not shown).

Further, in this embodiment, the desired suppression ratio for the distortion component located close to the first pilot signal component to the distortion component located close to the second pilot signal component is 7:3. However, the ratio may have another arbitrary value such as 10:0, 5:5, or 0:10. In this case, the switch 61 operates so that the first or second down convert signal is chosen according to this ratio.

Furthermore, the desired suppression ratio for the distortion components may vary depending on a change in distortion characteristic of the amplifier resulting from a change in temperature. In this case, the switch 61 may be operated so that the first or second down convert signal is chosen according to the variation in suppression ratio for the desired distortion components.

In Embodiments 1 to 4 according to the present invention, described above, a first and second pilot signal components generated by the first and second pilot signal sources, respectively, are taken out by passing through the band-pass filters 41 and 42, respectively. Consequently, changes in oscillation frequency and filter characteristic caused by a change in temperature affect the control circuit 20. Thus, degradation of circuit characteristics caused by a change in temperature can be reduced by selecting an oscillation element and a filter-constituting element to have the same temperature characteristic, compensating for the elements so that they have temperature characteristics with the same tendency, or heating the elements using the same oven so that the elements are maintained at the same temperature.

Further, in the description of the above embodiments, a signal taken out from the directional coupler 25 is distributed by the divider 52, and the distributed signals are passed through the band-pass filters 41 and 42, respectively, before being mixed together. However, the following procedure is also possible: A signal taken out from the directional coupler 25 is distributed by the divider 52, and one of the distributed signals is mixed with the second pilot signal, whereas the other is mixed with the first pilot signal. The mixed signals are passed through the filter and are then taken out as a first and a second down convert signals.

Furthermore, in the above description, the first pilot and second pilot signals are inserted into the input side of the main amplifier 16 for superimposition. However, these signals may be inserted into the output side of the main amplifier 16 for super imposition, and in this case, effects similar to those described above can also be produced.

According to the control circuits for the feedforward distortion compensation amplifier according to the above described embodiments, two pilot signals are used to suppress and control nonlinear distortion in the FF amplifier, thereby enabling optimization of distortion suppression over the entire frequency band of an actual multicarrier signal.

Furthermore, by using pilot signals, without providing any separate local oscillators, to down-convert signals so as to have an intermediate frequency band and then filtering or amplifying these signals, these signal processes can be easily executed than in the case with a higher frequency band, and circuit mounting becomes easier and more compact. Therefore, the present invention provides a small-sized and inexpensive control circuit for an FF amplifier which requires a reduced number of local oscillators.

According to the present invention, there can be provided a feedforward distortion compensation amplifier or a control circuit or method for a feedforward distortion compensation amplifier which require a reduced number of local oscillators and which enable optimization of distortion suppression over the entire frequency band of a multicarrier signal actually used in the FF amplifier.

What is claimed is:

1. A method of controlling a feedforward distortion compensation amplifier comprising steps of detecting a distortion component generated in a main amplifier by coupling a signal branched from a signal input to said main amplifier and containing a plurality of carriers of different frequencies to a signal branched from an output signal from said main amplifier so that the coupling causes the carrier components to cancel each other, recoupling the signal resulting from said coupling to the output signal from said main amplifier, and adjusting an amplitude and phase of at least one of the signals to be recoupled so that distortion components cancel each other upon recoupling, wherein a first and second pilot signals obtained from a first and second pilot signal sources are Inserted into the input signal to or output signal from the main amplifier, parts of the signal resulting from said recoupling are taken out through branching, said signal taken out through branching being passed through a predetermined frequency band filter to obtain a first pilot signal component that contains said first pilot signal but not said second pilot signal, and said first pilot signal component is mixed with said second pilot signal to obtain a first down convert signal having a frequency amounting to a difference between a frequency of said first pilot signal and said second pilot signal, and said signal taken out through branching being passed through another predetermined frequency band filter to obtain a second pilot signal component that contains said second pilot signal but not said first signal, and said second pilot signal component is mixed with said first pilot signal to obtain a second down convert signal having a frequency amounting to said difference such that control signals are generated to adjust said amplitude and phase according to said first and second down convert signals.

2. A circuit for controlling a feedforward distortion compensation amplifier comprising a distortion detection loop that detects a distortion component generated in a main amplifier by coupling a signal branched from a signal input to said main amplifier and containing a plurality of carriers of different frequencies to a signal branched from an output signal from said main amplifier so that the coupling causes the carrier components to cancel each other, a distortion compensation loop that recouples the signal resulting from said coupling to the output signal from said main amplifier, and means of adjusting an amplitude and phase of at least one of the signals to be recoupled so that distortion components cancel each other upon recoupling, wherein a first and second pilot signals obtained from a first and second pilot signal sources are inserted into the input signal to or output signal from the main amplifier, parts of the signal resulting from said recoupling are taken out through branching, said signal taken out through branching is passed through a predetermined frequency band filter to obtain a first pilot signal component that contains said first pilot signal but does not contain said second pilot signal, and said first pilot signal component is mixed with said second pilot signal to obtain a first down convert signal having a frequency amounting to a difference between a frequency of said first pilot signal and said second pilot signal, and said signal taken out through branching is passed through another predetermined frequency band filter to obtain a second pilot signal component that contains said second pilot signal but not said first signal, and said second pilot signal component is mixed with said first pilot signal to obtain a second down convert signal having a frequency amounting to said difference such that control signals are generated and provided to said means of adjusting according to said first and second down convert signals.

3. The circuit for controlling a feedforward distortion compensation amplifier according to claim 2, wherein said first pilot signal component is orthogonally mixed with said second pilot signal and thus down-converted to obtain a set of first down convert signals having a frequency amounting to a difference between a frequency of said first pilot signal and a frequency of said second pilot signal as well as quadrature phases, and said second pilot signal component is orthogonally mixed with said first pilot signal and thus down-converted to obtain a set of second down convert signals having a frequency amounting to said difference as well as quadrature phases.

4. The circuit for controlling a feedforward distortion compensation amplifier according to claim 2, wherein said first down convert signal and/or said second down convert signal is synchronously detected to generate at least one of said control signals using a signal for synchronized detection of the difference between the frequency of said first pilot signal and the frequency of said second pilot signal, the synchronized detection signal supplied by synchronized detection signal generating means of generating the synchronized detection signal using said first pilot signal and said second pilot signal.

5. The circuit for controlling a feedforward distortion compensation amplifier according to claim 3, wherein said set of first down convert signals having quadrature phases and/or said set of second down convert signals having quadrature phases are synchronously detected to generate at least one of said control signals using a signal for synchronized detection of the frequency difference between the frequency of said first pilot signal and the frequency of said second pilot signal, the synchronized detection signal supplied by synchronized detection signal generating means of generating the synchronized detection signal using said first pilot signal and said second pilot signal.

6. The circuit for controlling a feedforward distortion compensation amplifier according to claim 3, wherein a signal obtained by synthesizing in-phase components of said set of first down convert signals having quadrature phases and of said set of second down convert signals having quadrature phases, and a signal obtained by synthesizing quadrature components of said set of first down convert signals having quadrature phases and of said set of second down convert signals having quadrature phases are each synchronously detected to generate at least one of said control signals using a signal for synchronized detection of the frequency difference between the frequency of said first pilot signal and the frequency of said second pilot signal, the synchronized detection signal is supplied by synchronized detection signal generating means of generating the synchronized detection signal using said first pilot signal and said second pilot signal.

7. The circuit for controlling a feedforward distortion compensation amplifier according to claim 3, wherein said set of first down convert signals having quadrature phases and/or said set of second down convert signals having quadrature phases are respectively level detected to generate at least one of said control signals.

8. The circuit for controlling a feedforward distortion compensation amplifier according to any of claims 4 to 6, wherein said synchronized detection signal generating means mixes said first pilot signal and said second pilot signal together, allows passage of a part of said mixed signal which has a frequency amounting the difference between the frequency of said first pilot signal and the frequency of said second pilot signal, and distributes the signal obtained to a plurality of paths.

9. The circuit for controlling a feedforward distortion compensation amplifier according to claim 3, wherein said first down covert signal and said second down convert signal are alternately switched to be detected.

10. The circuit for controlling a feedforward distortion compensation amplifier according to claim 9, wherein time for detection using said first down convert signal and time for detection using said second down convert signal are determined by weighting.

11. The circuit for controlling a feedforward distortion compensation amplifier according to claim 10, wherein the frequencies of said first and second pilot signals are determined on the basis of all of said carriers, and said weighting is determined on the basis of those of all of said carriers which are actually used.

12. The circuit for controlling a feedforward distortion compensation amplifier according to claim 3, wherein elements constituting oscillators for said first and second pilot signal source, elements constituting a band-pass filter that takes out said first pilot signal by passing the signal therethrough, and elements constituting a band-pass filter that takes out said second pilot signal by passing the signal therethrough have substantially the same temperature characteristic.

13. The circuit for controlling a feedforward distortion compensation amplifier according to claim 3, wherein elements constituting oscillators for said first and second pilot signal source, elements constituting a band-pass filter that takes out said first pilot signal by passing the signal therethrough, and elements constituting a band-pass filter that takes out said second pilot signal by passing the signal therethrough are installed on ovens subjected to the same temperature control.

14. A feedforward distortion compensation amplifier, comprising:
- a distortion detection loop that detects a distortion component generated in a main amplifier by coupling a signal branched from a signal input to said main amplifier and containing a plurality of carriers of different frequencies to a signal branched from an output signal from said main amplifier so that the coupling causes the carrier components to cancel each other;
- a distortion compensation loop that recouples the signal resulting from said coupling to the output signal from said main amplifier; and
- means of adjusting an amplitude and phase of at least one of the signals to be recoupled so that distortion components cancel each other upon recoupling,
- wherein the amplifier comprises the circuit controlling a feedforward distortion compensation amplifier according to claim 3.

15. A method of controlling a feedforward distortion compensation amplifier including a main amplifier, the method comprising the steps of
- (a) coupling a signal branched from an input signal of the main amplifier with a signal branched from an output signal of the main amplifier;
- (b) recoupling an output signal resulting from step (a) to the output signal of the main amplifier;
- (c) adjusting an amplitude and phase of at least one of the signals to be recoupled in step (b) to cancel distortion components upon said recoupling step;
- (d) inserting first and second pilot signals into the input signal or output signal of the main amplifier;
- (e) branching a portion of the recoupled signal of step (b);
- (f) passing the branched portion of the recoupled signal of step (b) through a frequency band filter to obtain a first pilot signal component containing the first pilot signal but not the second pilot signal;
- (g) mixing the first pilot signal component of step (f) with the second pilot signal to obtain a first down convert signal having a frequency substantially equivalent to a difference between a frequency of the first pilot signal and the second pilot signal;
- (h) passing the branched portion of the recoupled signal of step (b) through another frequency band filter to obtain a second pilot signal component containing the second pilot signal but not the first pilot signal;
- (i) mixing the second pilot signal component of step (h) with the first pilot signal to obtain a second down convert signal having a frequency substantially equivalent to the difference between the frequency of the first pilot signal and the second pilot signal; and
- (i) generating control signals to adjust the amplitude and phase in step (c) based on the first and second down convert signals.

16. A circuit for controlling a feedforward distortion compensation amplifier comprising:
- a distortion detection loop that detects a distortion component generated in a main amplifier by coupling a signal branched from an input signal of the main amplifier with a signal branched from an output signal of the main amplifier;
- a distortion compensation loop that recouples an output signal resulting from the coupling to the output signal of the main amplifier;
- means of adjusting an amplitude and phase of at least one of the signals to be recoupled to cancel distortion components upon the recoupling;
- first and second pilot signal sources for providing first and second pilot signals for insertion into the input signal or output signal of the main amplifier;
- a first frequency band filter for receiving a branched portion of the recoupled signal and outputting a first pilot signal component containing the first pilot signal but not the second pilot signal;
- a first mixer for mixing the first pilot signal component with the second pilot signal to produce a first down convert signal having a frequency substantially equivalent to a difference between a frequency of the first pilot signal and the second pilot signal;
- a second frequency band filter for receiving the branched portion of the recoupled signal and outputting a second pilot signal component containing the second pilot signal but not the first pilot signal;
- a second mixer for mixing the second pilot signal component with the first pilot signal to produce a second down convert signal having the frequency substantially equivalent to a difference between a frequency of the first pilot signal and the second pilot signal; and
- a control signal generator outputting signals to the means of adjusting based on the first and second down convert signals.

* * * * *

UNITED STATES PATENT AND TRADEMARK OFFICE
CERTIFICATE OF CORRECTION

PATENT NO.     : 6,750,706 B2
DATED          : June 15, 2004
INVENTOR(S)    : Kaoru Ishida et al.

It is certified that error appears in the above-identified patent and that said Letters Patent is hereby corrected as shown below:

Title page,
Item [75], Inventors, delete "Shijonawate" and insert -- Osaka --, delete "Katano" and insert -- Osaka --; delete "Yokohama" and insert -- Kanagawa --; delete "Yokosuka" and insert -- Kanagawa --

Column 16,
Line 62, "Inserted" should read -- inserted --

Signed and Sealed this

Twelfth Day of April, 2005

JON W. DUDAS
*Director of the United States Patent and Trademark Office*